(12) United States Patent
Haberer

(10) Patent No.: US 9,365,410 B2
(45) Date of Patent: Jun. 14, 2016

(54) METHOD FOR PRODUCING A MICROMECHANICAL COMPONENT, AND MICROMECHANICAL COMPONENT

(71) Applicant: Robert Bosch GmbH, Stuttgart (DE)

(72) Inventor: Dietmar Haberer, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/624,071

(22) Filed: Feb. 17, 2015

(65) Prior Publication Data

US 2015/0232323 A1 Aug. 20, 2015

(30) Foreign Application Priority Data

Feb. 17, 2014 (DE) .......................... 10 2014 202 842

(51) Int. Cl.
| | | |
|---|---|---|
| *H01L 21/00* | (2006.01) | |
| *B81B 3/00* | (2006.01) | |
| *B81B 1/00* | (2006.01) | |
| *B81B 7/02* | (2006.01) | |
| *B81C 1/00* | (2006.01) | |

(52) U.S. Cl.
CPC . *B81B 1/004* (2013.01); *B81B 7/02* (2013.01); *B81C 1/00087* (2013.01); *B81C 1/00103* (2013.01); *B81B 2201/04* (2013.01); *B81B 2201/047* (2013.01); *B81B 2203/0353* (2013.01); *B81C 2201/0194* (2013.01); *B81C 2203/0172* (2013.01)

(58) Field of Classification Search
CPC ......... H01L 41/00; H01L 41/04; H01L 29/84; B81B 2203/0127; B81B 2203/0353; B81B 2201/04; B81B 1/004; B81B 7/02; B81B 2201/047; B81B 2207/99; B81B 2207/00; B81C 1/00103; B81C 1/00087
USPC ............. 257/618, E21.53, E21.527, E31.127, 257/419, 420, E29.324, E21.214; 438/29–48, 53
See application file for complete search history.

(56) References Cited

U.S. PATENT DOCUMENTS

| 2004/0097004 A1* | 5/2004 | Pogge ............... H01L 21/76898 438/52 |
| 2011/0163396 A1* | 7/2011 | Benzel ................. G10L 9/0055 257/415 |

FOREIGN PATENT DOCUMENTS

DE  10 2011 119610  5/2013

* cited by examiner

*Primary Examiner* — Jasmine Clark
(74) *Attorney, Agent, or Firm* — Norton Rose Fulbright US LLP

(57) ABSTRACT

A method for producing a micromechanical component, and a micromechanical component, includes providing a substrate having first and second outer surfaces, the second surface facing away from the first surface; forming a through-hole through the substrate from the first outer surface up to the second outer surface; attaching an optical functional layer, on the second outer surface, to cover the through-hole; removing a first segment of the substrate on the first surface of the substrate so that there arises a third outer surface inclined relative to the second surface, the third surface facing away from the second surface, the inclined surface enclosing the through-hole; and separating the micromechanical component by separating a first part of the substrate, having the through-hole, and a second part, attached to the first part, of the optical functional layer from a remaining part of the substrate and a remaining part of the optical functional layer.

8 Claims, 4 Drawing Sheets

METHOD FOR PRODUCING A MICROMECHANICAL COMPONENT, AND MICROMECHANICAL COMPONENT

RELATED APPLICATION INFORMATION

The present application claims priority to and the benefit of German patent application no. 10 2014 202 808.6, which was filed in Germany on Feb. 17, 2014, the disclosure of which is incorporated herein by reference.

FIELD OF THE INVENTION

The present invention relates to a method for producing a micromechanical component, and to a micromechanical component, in particular to a method for producing an inclined and hermetically sealed window, as well as to an inclined and hermetically sealed window.

BACKGROUND INFORMATION

Micromechanical components frequently perform optical functions, for example as micro-mirrors, light-emitting devices, or light sensors. The optically functioning elements in each case, for example micro-mirrors, can either be produced unsealed, or can be hermetically tightly capped, which can improve the operating life and functionality of the micromirror.

German patent document DE 10 2011 119 610 A1 discusses a method for producing structured optical components, in particular covers for the encapsulation of microsystems. Reinforcing elements produced before being connected are attached on a first substrate, producing a stack. After connection with a second substrate, the stack is heated, causing the first substrate to be deformed in such a way that at least one region of the first substrate covered by the reinforcing elements is displaced and/or inclined.

SUMMARY OF THE INVENTION

The present invention discloses a method having the features described herein, and a micromechanical component having the features described herein.

Accordingly provided is a method for producing a micromechanical component, having the steps:
provision of a substrate having a first outer surface and having a second outer surface facing away from the first outer surface;
formation of a through-hole through the substrate from the first outer surface of the substrate up to the second outer surface of the substrate;
attachment of an optical functional layer on the second outer surface of the substrate, the optical functional layer covering the through-hole;
removal of a first segment of the substrate on the first outer surface of the substrate in such a way that there arises a third outer surface that is inclined relative to the second outer surface of the substrate, the third surface facing away from the second outer surface of the substrate, the inclined third outer surface enclosing the through-hole; and
separation of the micromechanical component through separation of a first part of the substrate, having the through-hole, and of a second part, attached to the first part, of the optical functional layer from a remaining part of the substrate and from a remaining part of the optical functional layer.

Also provided is a micromechanical component having: a substrate having a first outer surface and having a second outer surface facing away from the first outer surface; a through-hole through the substrate from the first outer surface of the substrate up to the second outer surface of the substrate; an optical functional layer attached on the second outer surface of the substrate, the optical functional layer covering the through-hole; the substrate having the through-hole and a third outer surface that is inclined relative to the second outer surface of the substrate, the third surface facing away from the second outer surface of the substrate, and the inclined third outer surface enclosing the through-hole.

The finding that forms the basis of the present invention is that the technical outlay for the production of micromechanical components that include inclined and hermetically sealed windows can be greatly reduced by processing at the wafer level. Accordingly, the present invention describes such a production method, as well as such a micromechanical component. Such an inclined and hermetically sealed window can advantageously be used for the tight capping of a micromechanical component having optical functions.

The optical functional layer can, at least in some regions, contain or be made of glass, which may be a silicate glass, particularly boron silicate glass, and/or a material similar to glass. Such materials offer particularly advantageous optical properties for a large number of applications.

Advantageously, the micromechanical component is not produced on a single-die basis, but rather is processed at the wafer level. In this way, in a few process steps a complete wafer can be produced, for example having about 1000 inclined and hermetically sealed windows, i.e. having inclined optical access points. Further processing using standard bonding processes is easily possible in this way. Using a technically simple arrangement, the complete wafer can for example be connected to another wafer having a large number of optical functional elements. The optical functional elements can for example be micro-mirrors, light-emitting devices, or light sensors. A separation of the micromechanical component is possible before or after a hermetic capping of an optical functional element by the component.

Through the processing on a wafer basis, a considerable reduction can be achieved in the technical outlay, in that a large number of micromechanical components results essentially simultaneously, and existing production and installation resources, themselves highly optimized, can to a large extent be used for this.

Advantageous specific embodiments and developments result from the subclaims and from the description, with reference to the Figures.

According to an exemplary development, the inclined third outer surface of the substrate encloses an acute angle with the second outer surface of the substrate. The angle can be in a range between 5° and 30°, in particular in a range between 8° and 25°, which may be in a range between 10° and 18°. An angle in one of these ranges enables a particularly versatile and efficient use of the micromechanical component.

According to a further development, the method further includes the steps: attachment of an adhesive film on an outer surface of the optical functional layer, the outer surface facing away from the substrate; cutting of the substrate and of the optional functional layer in such a way that there results a second segment of the substrate and of the optical functional layer attached thereon, the second segment containing the inclined outer surface and the through-hole, and the second segment being connected to the rest of the substrate and to the rest of the optical functional layer via the adhesive film; placement of the cut substrate and of the optical functional layer onto a profiled base in such a way that the second segment comes to be situated over a first opening in the profiled base, and detachment of the second segment from the adhesive film in such a way that the second segment is separated and lies with the inclined third outer surface of the substrate in the first opening on the profiled base.

According to a further development, the method further includes the steps: placement of a bonding tool having a second opening on the profiled base in such a way that the second opening lies against the first opening with the second segment situated therein; and guiding of the second segment into the second opening of the bonding tool.

According to a further development, the second opening of the bonding tool is fashioned in such a way that the inclined third outer surface of the second segment, after the guiding of the second segment into the second opening of the bonding tool, is situated flush with a fourth outer surface of the bonding tool. In this way, a particularly high degree of compatibility of the bonding tool with other wafers is provided.

According to a further development, the guiding takes place through a rotation of the profiled base and bonding tool, lying against one another, using gravity; i.e., the second segments fall downward into the bonding tool under their own weight. Such a procedure has a particularly low technical outlay.

According to a further development, the guiding takes place through suctioning the second segment on to the profiled base, and/or through suctioning the second segment on the bonding tool, and/or through pressing the second segment onto the bonding tool using pressurized air. In this way, a particularly precise handling, as well as adjustment if necessary, of the second segments is enabled.

According to a further development, the method also includes the step: bonding of the second segment onto a functional element of a wafer using the bonding tool, the separation of the micromechanical component from a remaining part of the second segment and from a remaining part of the wafer taking place after the bonding. In this way, a particularly large number of micromechanical components according to the present invention can be simultaneously produced at the wafer level, and in this way the technical outlay per micromechanical component can be greatly reduced.

According to a further development, the through-hole of the micromechanical component has, in a cross-sectional plane through the substrate situated perpendicular to the first outer surface and/or perpendicular to the second outer surface of the substrate, a cross-section that is trapezoidal and/or parallelogram-shaped and/or rectangular. This can be advantageous for specific beam paths that are intended to pass through the through-hole.

In the following, the present invention is explained in more detail on the basis of the exemplary embodiments shown in the schematic Figures of the drawings.

In all the Figures, identical or functionally identical elements and devices have been provided with the same reference characters, unless otherwise indicated.

DETAILED DESCRIPTION

Figure 1:
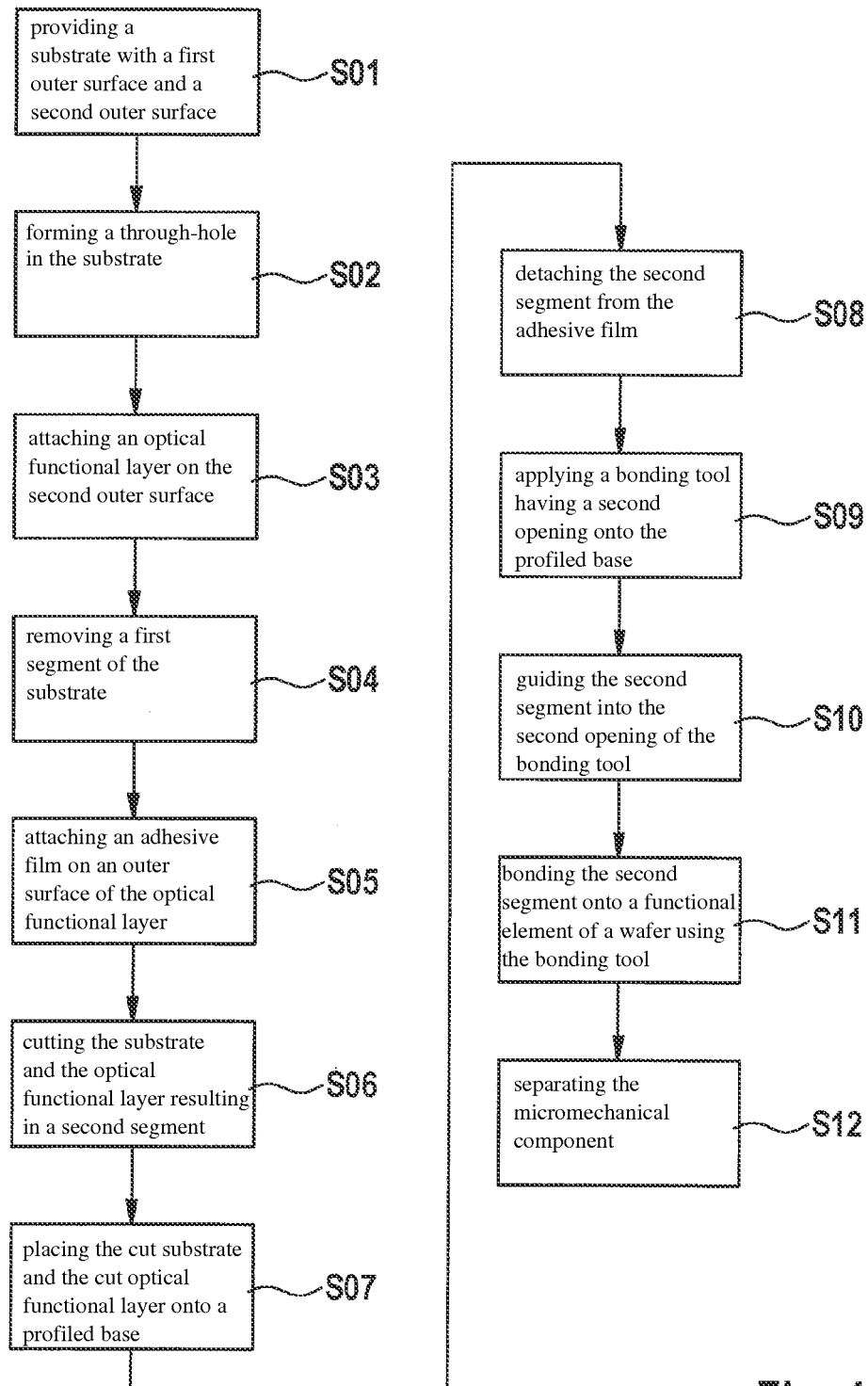
FIG. 1 shows a schematic flow diagram for the explanation of a method for producing a micromechanical component according to a first specific embodiment of the present invention.

FIG. 1 shows a schematic flow diagram for the explanation of a method for producing a micromechanical component according to a first specific embodiment of the present invention.

In the description of FIG. 1, reference is also made to the following FIGS. 2 through 6, and to reference characters occurring therein. The numbering of method steps by reference characters is provided only for clarity, and is not intended to imply any temporal sequence, unless otherwise explicitly indicated. In particular, two or more method steps can also take place simultaneously. In the reference characters, the letters "i" and "j" act as placeholders for numbers in order to improve the readability of the description and to keep the description concise.

In a method step 501, a substrate 10 is provided having a first outer surface 10-$f$ and having a second outer surface 10-$b$. Second outer surface 10-$b$ faces away from first outer surface 10-$f$. Substrate 10 can in particular be a silicon wafer. In particular, first outer surface 10-$f$ can be parallel to second outer surface 10-$b$, as is essentially the case in standard silicon wafers.

In a method step S02, at least one through-hole 12-$ij$ is fashioned through substrate 10, from first outer surface 10-$f$ of substrate 10 up to second outer surface 10-$b$ of substrate 10. Formation S02 of the at least one through-hole 12-$ij$ can for example be accomplished using a KOH etching process. The at least one through-hole 12-$ij$ can have a trapezoidal and/or a rectangular cross-section in a cross-sectional plane through substrate 10 that stands perpendicular to the first and/or to the second outer surface 10-$f$, 10-$b$ of substrate 10.

In a method step S03, an optical functional layer 14 is attached on second outer surface 10-$b$ of the substrate, optical functional layer 14 covering the at least one through-hole 12-$ij$. That is, a first opening 13-$ij$ of through-holes 12-$ij$ on second outer surface 10-$b$ of the substrate is hermetically sealed by optical functional layer 14.

Figure 2:
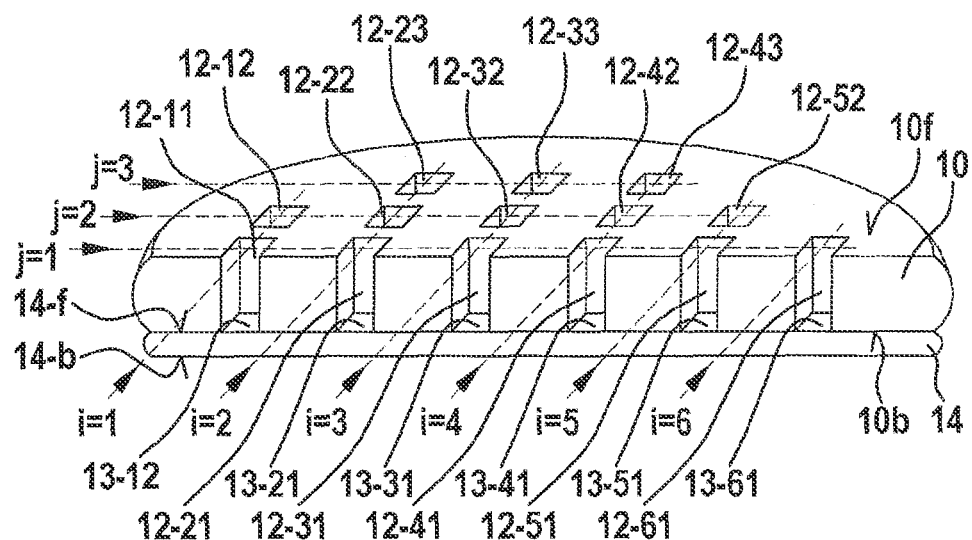
FIG. 2 shows a schematic view of a first intermediate state in the method according to the first specific embodiment of the present invention.

FIG. 2 shows a schematic view of a first intermediate state in the method according to the first specific embodiment of the present invention. In FIG. 2, method steps S01 through S03 have already taken place. A multiplicity of through-holes 12-$ij$ are shown, configured in rows j and columns i, so that for example 12-12 designates a through-hole in a first column i=1 and in a second row j=2 on substrate 10. Only a part of substrate 10 is shown, which has been cut through in a plane perpendicular to first and second outer surface 10-$f$, 10-$b$ of substrate 10 in order to illustrate the structure of through-holes 12-$ij$.

The number of through-holes 12-$ij$ shown is only schematic; it is also possible to make fewer through-holes 12-$ij$ per substrate 10, but also more through-holes 12-$ij$ per substrate 10, for example on the order of magnitude of hundreds or thousands of through-holes 12-$ij$ per substrate 10, or even more. Through-holes 12-*j* [sic] can all have the same structure, but can also differ from one another, for example in that a plurality of KOH etching processes are carried out, forming different through-hole structures.

According to the first specific embodiment, optical functional layer 14 is a glass wafer bonded on second outer surface 10-*b* of substrate 10 in an anodic bonding method. According to FIG. 2, optical functional layer 14 has a first outer surface 14-*f* onto which second outer surface 10-*b* of substrate 10 is bonded. Optical functional layer 14 further has a second outer surface 14-*b* of optical functional layer 14 that faces away from first outer surface 14-*f* of optical functional layer 14, and in particular is parallel thereto.

A coating, for example an anti-reflective layer, can be applied on first and/or second outer surface 14-*f*, 14-*b* of optical functional layer 14. If first outer surface 14-*f* of optical functional layer 14 has a coating, optical functional layer 14, having the coating applied on first outer surface 14-*f*, can be bonded directly on second outer surface 10-*b* of substrate 10. If first outer surface 14-*f* of optical functional layer 14 does not have a coating, first outer surface 14-*f* of optical functional layer 14 can be bonded directly onto second outer surface 10-*b* of substrate 10. The coating on second outer surface 14-*b* of optical functional layer 14 can also be applied at a later time.

In a method step S04, first segments 18-2 of substrate 10 on first outer surface 10-*f* of substrate 10 are removed.

Figure 3:
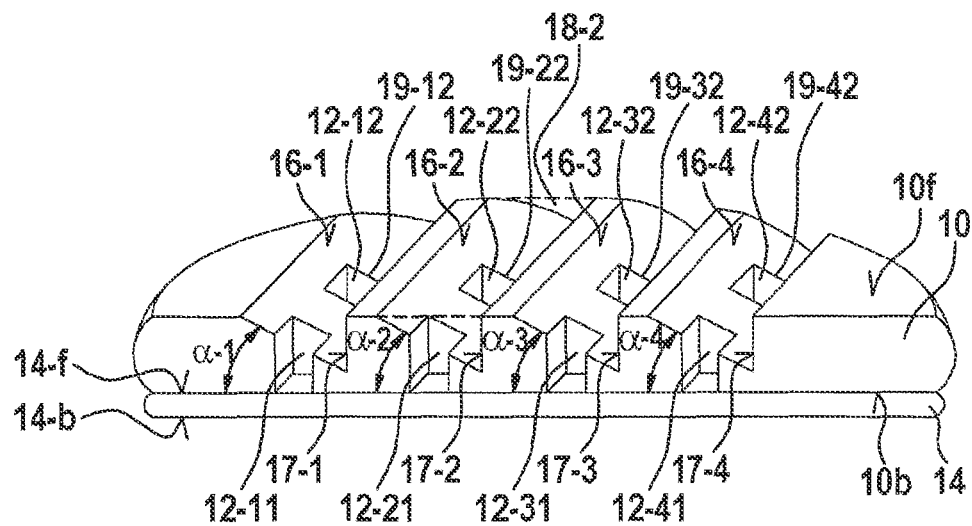
FIG. 3 shows a schematic view of a second intermediate state in the method according to the first specific embodiment of the present invention.

FIG. 3 shows a schematic view of a second intermediate state in the method according to the first specific embodiment. In FIG. 3, only four of the through-holes 12-*ij* shown in FIG. 2 are shown. For each column of through-holes 12-*ij*, in each case a second segment of substrate 10 on first outer surface 10-*f* of the substrate is removed. For the removed first segment 18-2 in the second column of through-holes 12-2*j*, the original position of the first segment 18-2 is shown in broken lines. For clarity, the first, third, and fourth column of through-holes 12-1*j*, 12-3*j*, 12-4*j* are shown with first segments already removed.

According to the first specific embodiment, the first segments have a wedge shape, an acute angle of the wedge being situated between the first outer surface 10-*f*, imagined as continuous, of substrate 10, and a third outer surface 16-*i* of substrate 10, newly created by removal S04. Through removal S04 of the first segments of substrate 10, for each column of through-holes 12-*ij* there results in each case an inclined third outer surface 16-*i* facing away from second outer surface 10-*b* of substrate 10. Each inclined third surface 16-*i*, and/or its imagined extension to form a plane, encloses an acute angle a-i with second outer surface 10-*b* of substrate 10.

If first and second outer surface 10-*f*, 10-*b* of substrate 10 are parallel to one another, then angle α–i and the acute angle of the wedge of the wedge shape of inclined third outer surface 16-*i* can be alternate angles. The acute angles α-i can each be equal, but can also be different for each inclined third outer surface 16-*i*, or for each column of through-holes 12-*ij*. The removal S04 of the first segments of substrate 10 can also take place in such a way that a plurality of differently inclined third outer surfaces 16-*i* arise in a column of through-holes 12-*ij*.

According to the first specific embodiment, the first segments are removed column-by column in each case for all through-holes 12-*ij* of a column, and for all columns with the same acute angle α–i, i.e. α–1=α–2=α–3=α–4. The removal can for example take place using an edge trimmer or a wafer saw. Perpendicular outer surfaces 17-*i* resulting from the removal of the first segments can be situated parallel to a crystal orientation and/or to a notch and/or flat of substrate 10. The geometrical shape and dimensions of the first segments, in particular including a width of the first segments in a direction along the rows of through-holes 12-*ij*, can be adapted to the intended target layout in the particular case.

After the removal S04 of the first segments of substrate 10, the majority, or all, through-holes 12-*ij* are each enclosed by an inclined third outer surface 16-*i*. That is, in each case a second opening 19-*ij* of its through-hole 12-*ij* facing away from second outer surface 10-*b* of substrate 10 is completely surrounded by an inclined third surface 16-*i*.

In a method step S05, the wafer as produced up to this point, and the optical functional layer 14, having second outer surface 14-*b* of optical functional layer 14, are attached onto an adhesive film 15, for example a blue tape. UV tapes can for example be used as material for the blue tape.

In a method step S06, the wafer, i.e. substrate 10 and optical functional layer 14, are cut in such a way that there arises at least one second segment 20-*i* of substrate 10 and of optical functional layer 14 attached thereon, i.e. of the wafer.

Figure 4:
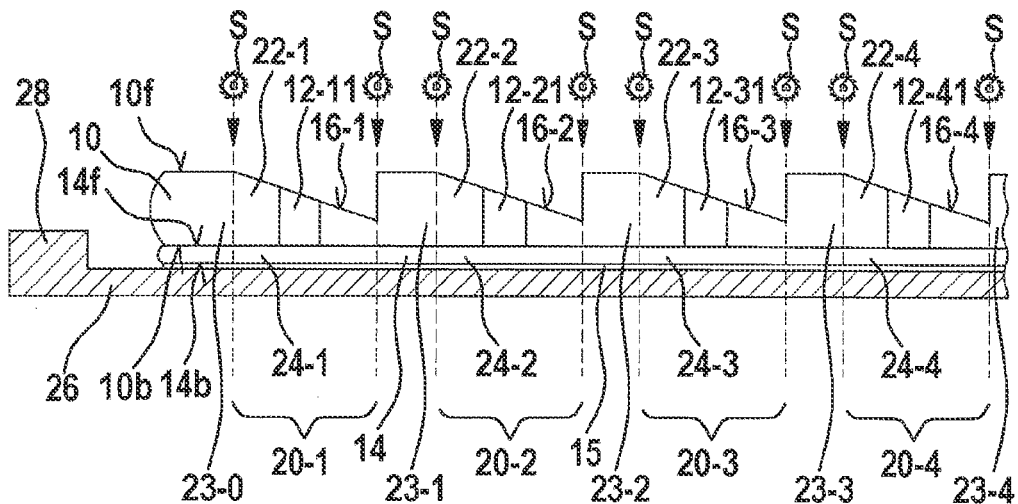
FIG. 4 shows a schematic cross-sectional view of a third intermediate state in the method according to the first specific embodiment of the present invention.

FIG. 4 shows a schematic cross-sectional view of a third intermediate state in the method according to the first specific embodiment of the present invention. FIG. 4 shows the wafer, placed on a tablet 26 with a circumferential holding ring 28 with a non-adhesive side of adhesive film 15. According to the first specific embodiment, cutting S06 takes place in such a way that second segments 20-*i* have a trapezoidal cross-section, such that in each case an inclined third outer surface 16-*i* completely forms an edge of the trapezoid that is not parallel to any other side of the trapezoid. Second segments 20-*i* further contain all through-holes 12-*j* of the respective column of through-holes 12-*ij*, which surrounds the corresponding inclined outer surface 16-*i*. In step S06, the component can also already be separated.

Sectional planes at which, according to the first specific embodiment, the wafer is sawed parallel to the first and second outer surface 10-*f*, 10-*b* of substrate 10, or parallel to the normal to the wafer, are identified in FIG. 4 by circular saw symbols S. Thus, each second segment 20-*i* includes a first part 22-*i* of substrate 10 having the respective inclined third outer surface 16-*i*, as well as a second part 24-*i*, attached to first part 22-*i*, of optical functional layer 14. Second segments 20-*i*, as well as remaining segments 23-*i* resulting between second segments 20-*i*, are in addition fixed to adhesive film 15.

Based on the values for the angle α–i, one of two parallel edges of the trapezoidal cross-sections of second segments 22i can be significantly smaller than the other of the parallel edges, and in this way the trapezoidal cross-section can become almost triangular. The ratio of the two parallel edges of the trapezoidal cross-section can for example be 1:2, 1:3, 1:5, but also 1:10 or less.

In a method step S04, the sawed wafer with adhesive film 15 is rotated and is placed into a profiled base 30, a transfer form, and is adjusted if necessary. Profiled base 30 has first openings 32-*i* over which each of the second segments 20-*i* respectively comes to be situated during application step S07.

Figure 5:
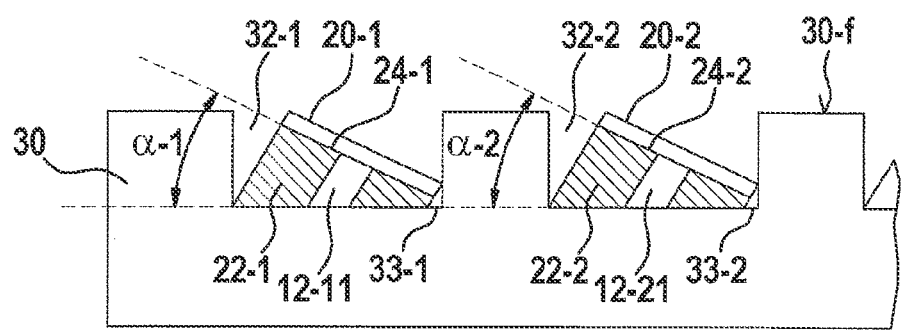
FIG. 5 shows a schematic view of a fourth intermediate state in the method according to the first specific embodiment of the present invention.

FIG. 5 shows a schematic view of a fourth intermediate state in the method according to the first specific embodiment of the present invention. According to FIG. 5, openings 32-*i* of profiled base 30 have a cuboid shape, and in particular have a rectangular cross-section in a plane in which second segments 20-*i* have the trapezoidal cross-section.

In a method step S08, second segments 20-*i* are detached from adhesive film 15. Second segments 20-*i* are in this way separated from one another and from the remaining segments 23-*i*, and are situated in each case with their inclined third outer surface 16-*i* in a respective first opening 32-*i* on the profiled base. According to the first specific embodiment, openings 32-*i* are fashioned in such a way that the separated second segments 20-*i* do not protrude from an outer surface 30-*f* of the profiled base 30, openings 32-*i* being fashioned in outer surface 30-*f* of profiled base 30, i.e. being open toward this surface. According to the first specific embodiment, after detachment S08 second segments 20-*i* each lie on a floor surface 33-*i* in openings 32-*i*, the floor surface being parallel to outer surface 30-*f* of profiled base 30.

Detachment S08 can for example take place through exposure of adhesive film 15 to light, if as adhesive film 15 a UV tape is used that loses its adhesive properties when exposed to light. For the detachment S08, rounded-off needles can also be pressed through adhesive film 15.

In a method step S09, a bonding tool 34 having second openings 36-*i* is placed onto profiled base 30 in such a way that second openings 36-*i* lie on first openings 32-*i* with second segments 20-*i* situated therein.

Figure 6:
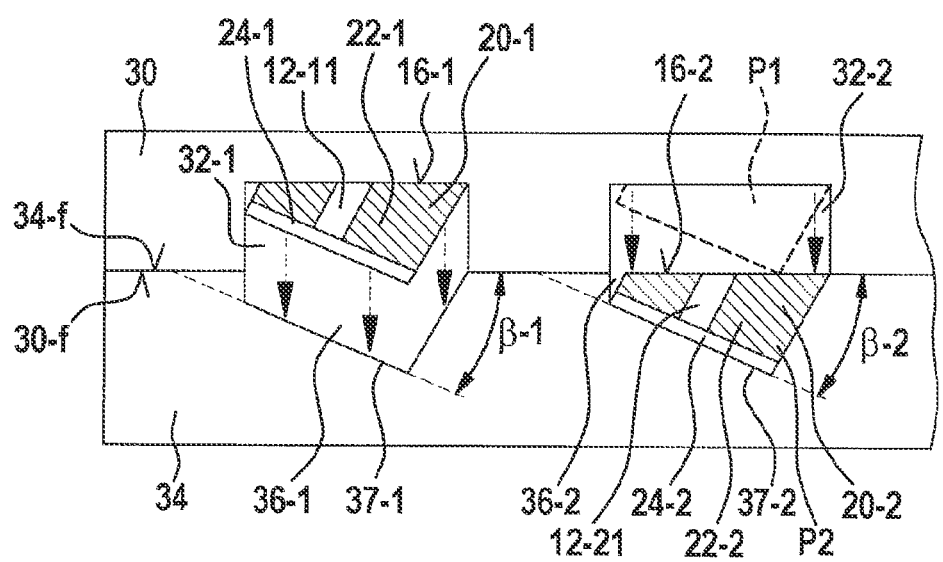
FIG. 6 shows a schematic view of a fifth intermediate state in the method according to the first specific embodiment of the present invention.

FIG. 6 shows a schematic view of a fifth intermediate state in the method according to the first specific embodiment of the present invention.

FIG. 6 shows how bonding tool 34 lies, with an outer surface 34-*f* of bonding tool 34, on outer surface 30-*f* of profiled base 30. Outer surfaces 34-*f*, 30-*f* of bonding tool 34 and of profiled base 30 can also have matching inverted structures, which can improve the lateral hold on one another.

In a method step S10, second segments 20-*i* are guided into second openings 36-*i* of bonding tool 34. Here, each second segment 20-*i* is guided into that second opening 36-*i* that lies against that first opening 32-*i* in which the respective second segment 20-*i* is or was situated.

According to the first specific embodiment, bonding tool 34 and profiled base 30, lying against one another, are rotated by 180°, so that guiding S10 takes place in that second segments 20-*i* are guided by their own gravity from a first position P1 in first openings 32-*i* into a second position P2 in second openings 36-*i*.

Second openings 36-*i* in bonding tool 34 are fashioned in such a way that second segments 20-*i* come to be situated in second position P2 in such a way that inclined third surfaces 16-*i* of second segments 20-*i* are situated at the same level as outer surface 34-*f* of bonding tool 34. That is, inclined third outer surfaces 16-*i*, in second position P2, are each situated within a plane in which outer surface 34-*f* of bonding tool 34 is also situated.

For this purpose, according to the first specific embodiment second openings 36-*i* each have a floor surface 37-i that is inclined relative to the outer surface 34-*f* of bonding tool 34. Inclined floor surfaces 37-*i* and/or their imagined extension to form a plane enclose, in each case, an angle β–i with outer surface 34-*f* of bonding tool 34. According to the first specific embodiment, β–1=α–1, β–2=α–2, and so on; i.e., β–i=α–i.

From here, bonding tool 34 can be removed from profiled base 30. In addition, a wafer bonding process can now be carried out. In a method step S11, second segments 20-*i* can each be bonded onto a functional element of a further wafer using bonding tool 34. The functional elements of the further wafer can for example be micro-mirrors, light-emitting devices, and/or light sensors.

In a method step S12, the micromechanical component is separated. According to the first specific embodiment, each micromechanical component contains only exactly one through-hole 12-*j*, as well as one or more functional elements of the further wafer, situated on through-hole 12-*ij*. However, it is also conceivable that micromechanical components are separated that each have a plurality of through-holes 12-*j*. The separation of the micromechanical components can also take place before or instead of bonding step S11. Second segments 20-*i* can already be fashioned in such a way that they no longer need to be separated. In this case, method steps S12 and S06 can for example coincide.

Although in the foregoing the present invention has been explained on the basis of exemplary embodiments, it is not limited thereto, but rather can be modified in many ways. In particular, the present invention can be modified in many ways without departing from the core idea of the present invention.

The guiding S10 of second segments 20-*i* can be accomplished both manually, by hand, and also in automated fashion. The automated rotation and placement of second segments 20-*i* into bonding tool 34 can take place by handling/robots. In addition, according to a second specific embodiment, guidance S10 of second segments 20-*i* into profiled base 30, and/or the fixing in profiled base 30, can take place with the assistance of pressurized air and/or a vacuum.

Various standard types of tape can be used as fixing tape, i.e. as adhesive film 15. For the detachment step S08, the specific properties of the fixing tape can be taken into account.

The seal glass required for the bonding process can either be brought along through the actuator stack, i.e. the further wafer, or the seal glass pressure can take place directly on second segments 20-*i* situated in bonding tool 34, together with bonding tool 34.

What is claimed is:

1. A method for producing a micromechanical component, the method comprising:

providing a substrate having a first outer surface and a second outer surface, which faces away from the first outer surface;

forming a through-hole through the substrate from the first outer surface of the substrate up to the second outer surface of the substrate, such that a first opening of the through-hole is enclosed by the first outer surface of the substrate, and a second opening of the through-hole is enclosed by the second outer surface of the substrate;

attaching an optical functional layer on the second outer surface of the substrate, wherein the optical functional layer covers the second opening of the through-hole;

removing a first segment of the substrate that includes the first opening of the through-hole on the first outer surface of the substrate so that there arises a third outer surface that is inclined relative to the second outer surface of the substrate, the third outer surface facing away from the second outer surface of the substrate, the inclined third outer surface enclosing a third opening of the through-hole; and separating the micromechanical component by separating a first part of the substrate, which includes the through-hole, from a remaining part of the substrate, and separating a second part of the optical functional layer, which is attached to the first part, from a remaining part of the optical functional layer.

2. The method of claim 1, wherein a plane containing the inclined third outer surface of the substrate and a plane containing the second outer surface of the substrate intersect at an angle that is in a range between 5° and 30°.

3. The method of claim 1, further comprising:

attaching an adhesive film on an outer surface of the optical functional layer, the outer surface facing away from the substrate;

cutting the substrate and the optional functional layer so that there results a second segment, the second segment including a part of the substrate that includes the through-hole and the third outer surface and a part of the optical functional layer that is attached to the part of the substrate including the through-hole and the third outer surface, and the second segment being connected to the rest of the substrate and to the rest of the optical functional layer via the adhesive film;

placing the cut substrate and the cut optical functional layer onto a profiled base so that the second segment comes to be situated over a first opening of the profiled base; and detaching the second segment from the adhesive film so that the second segment is separated and lies with the inclined third outer surface of the substrate in the first opening of the profiled base.

4. The method of claim 3, further comprising:

applying a bonding tool having a second opening onto the profiled base so that the second opening lies directly over the first opening with the second segment situated therein; and guiding the second segment into the second opening of the bonding tool.

5. The method of claim 4, wherein the second opening of the bonding tool is configured so that after guiding the second segment into the second opening of the bonding tool, the inclined third outer surface of the second segment is situated flush with a fourth outer surface of the bonding tool.

6. The method of claim 4, wherein the guiding occurs through a rotation of the profiled base and the bonding tool, which lie against one another, making use of gravity.

7. The method of claim 4, wherein the guiding occurs through suctioning of the second segment onto the profiled base and/or through suctioning of the second segment onto the bonding tool and/or through pressing of the second segment onto the bonding tool using pressurized air.

8. The method of claim 4, further comprising:

bonding the second segment onto a functional element of a wafer using the bonding tool, wherein the separation of the micromechanical component from a remaining part of the second segment and from a remaining part of the wafer occurs after the bonding.

* * * * *